US012631693B2

(12) United States Patent
Xing

(10) Patent No.: US 12,631,693 B2
(45) Date of Patent: May 19, 2026

(54) APPARATUS, METHOD AND SYSTEM FOR DETECTING AN ISLANDING STATE OF A POWER GENERATION DEVICE

(71) Applicant: Schneider Electric Industries SAS, Rueil-Malmaison (FR)

(72) Inventor: Jinlei Xing, Shanghai (CN)

(73) Assignee: Schneider Electric Industries SAS, Rueil Malmaison (FR)

(*) Notice: Subject to any disclaimer, the term of this patent is extended or adjusted under 35 U.S.C. 154(b) by 232 days.

(21) Appl. No.: 18/516,441

(22) Filed: Nov. 21, 2023

(65) Prior Publication Data

US 2024/0168102 A1     May 23, 2024

(30) Foreign Application Priority Data

Nov. 22, 2022   (CN) .......................... 202211467695.5

(51) Int. Cl.
G01R 31/42 (2006.01)
G01R 19/25 (2006.01)

(52) U.S. Cl.
CPC ......... G01R 31/42 (2013.01); G01R 19/2513 (2013.01)

(58) Field of Classification Search
CPC .. G01R 31/42; G01R 19/2513; G01R 31/086; H02J 3/0012; H02J 13/00002; H02J 3/388
USPC .................................... 324/764.01, 537, 500
See application file for complete search history.

(56) References Cited

U.S. PATENT DOCUMENTS

| | | | | |
|---|---|---|---|---|
| 9,806,513 B2 * | 10/2017 | Jacobson | ............... | H02H 7/008 |
| 11,646,573 B2 * | 5/2023 | Quinlan | ............ | H02J 13/00032 |
| | | | | 307/43 |
| 2013/0116946 A1 * | 5/2013 | Familiant | .................. | H02J 3/00 |
| | | | | 702/58 |
| 2015/0120221 A1 * | 4/2015 | Ding | ......................... | H02J 3/38 |
| | | | | 702/60 |
| 2022/0069578 A1 * | 3/2022 | Bickel | ...................... | H02J 3/001 |
| 2025/0219407 A1 * | 7/2025 | Hakunti | .............. | H02J 13/0004 |

* cited by examiner

*Primary Examiner* — Giovanni Astacio-Oquendo
(74) *Attorney, Agent, or Firm* — Quinn IP Law

(57) ABSTRACT

An apparatus for detecting an islanding state of a power generation device is disclosed. The apparatus includes a first acquisition unit for acquiring a first current amount at a substation; a second acquisition unit for acquiring a second voltage phasor at the power generation device; a processing unit connected with the first acquisition unit and the second acquisition unit, for determining the interconnection impedance between the power generation device and the substation according to the ratio of the variation of the second voltage phasor and the variation of the first current within the same time period, and determining that the power generation device is in an islanding state under the condition that the interconnection impedance meets a predetermined condition. Furthermore, a method for detecting an islanding state of a power generation device and a system for detecting the islanding state of the power generation device is disclosed.

19 Claims, 3 Drawing Sheets

APPARATUS, METHOD AND SYSTEM FOR DETECTING AN ISLANDING STATE OF A POWER GENERATION DEVICE

TECHNICAL FIELD

The present disclosure relates to an apparatus for detecting an islanding state of a power generation device, a method for detecting an islanding state of a power generation device, and a system for detecting an islanding state of a power generation device.

BACKGROUND

Islanding means that when a power supply interruption happens on a main power grid side, a power generation device fails to detect the disconnection from the main power grid in time and therefore does not stop operating, making the power generation device and its nearby loads form a self-sufficient island power grid. The island power grid cannot be controlled by the operator of the main power grid. In the islanding state, there may be a significant rated voltage offset and a rated frequency offset, which will lead to abnormal operation or damage to the electrical devices in the island power grid. Furthermore, when the power generation device in the island is reconnected to the grid, there may be inconsistent phase sequence, different sizes of amplitudes and different phases between the voltage of the main grid side and the voltage of the power generation device side, a differential voltage will be produced, and thus will cause a large surge current. This will damage the power quality and damage the electrical device and power generation device. For renewable energy power generation devices, e.g., photovoltaic devices and wind turbines, the islanding state will also affect the normal operation of the inverter in the power generation device. Under the condition that the power supply interruption of the power grid happens, the power generation device in the island makes the electrical device in the island still charged, which will cause misjudgment of the maintenance personnel and thus threaten personal safety. Therefore, when an islanding occurs, the occurrence of the islanding needs to be detected as soon as possible.

SUMMARY

The present disclosure provides an apparatus for detecting an islanding state of a power generation device, a method for detecting an islanding state of a power generation device and a system for detecting an islanding state of a power generation device. The apparatus, method and system for detecting the islanding state of a power generation device according to the present disclosure are capable of determining whether the power generation device is separated from the main power grid and therefore is in the islanding state under the condition that the power quality changes only slightly.

An embodiment of the present disclosure provides an apparatus for detecting an islanding state of a power generation device, the apparatus includes: a first acquisition unit for acquiring a first current amount at a substation; a second acquisition unit for acquiring a second voltage phasor at the power generation device; a processing unit connected with the first acquisition unit and the second acquisition unit, for determining the interconnection impedance between the power generation device and the substation according to the ratio of the variation of the second voltage phasor and the variation of the first current within a same time period, and determining that the power generation device is in an islanding state under the condition that the interconnection impedance meets a predetermined condition.

According to an embodiment of the present disclosure, a first current amount is a first current phasor.

According to an embodiment of the present disclosure, before determining an interconnection impedance, a processing unit compares the modulus of the variation of a second voltage phasor with a predetermined voltage change threshold, and the processing unit determines the interconnection impedance under the condition that the modulus of the variation of the second voltage phasor is greater than or equal to the predetermined voltage change threshold.

According to an embodiment of the present disclosure, before determining the interconnection impedance, the processing unit compares the modulus of the second voltage phasor with a predetermined upper voltage threshold and a predetermined lower voltage threshold, and determines that the power generation device is in an islanding state under the condition that the modulus of the second voltage phasor is greater than the predetermined upper voltage threshold or less than the predetermined lower voltage threshold.

According to an embodiment of the present disclosure, before determining the interconnection impedance, the processing unit compares the frequency value of the second voltage phasor with a predetermined upper frequency threshold and a predetermined lower frequency threshold, and determines that the power generation device is in an islanding state under the condition that the frequency value of the second voltage phasor is greater than the predetermined upper frequency threshold or less than the predetermined lower frequency threshold.

An embodiment of the present disclosure provides a method for detecting an islanding state of a power generation device, the method includes: acquiring a first current amount at a substation; acquiring a second voltage phasor at the power generation device; determining the interconnection impedance between the power generation device and the substation according to the ratio of the variation of the second voltage phasor and the variation of the first current within a same time period, and determining that the power generation device is in an islanding state under the condition that the interconnection impedance meets a predetermined condition.

An embodiment of the present disclosure provides a system for detecting an islanding state of a power generation device, the system includes: the aforementioned device for detecting the islanding state of the power generation device; a first measuring unit arranged at a substation for measuring a first current amount at the substation; a second measuring unit arranged at the power generation device for measuring a second voltage phasor at the power generation device; wherein the apparatus is connected with the first measuring unit and the second measuring unit.

According to an embodiment of the present disclosure, the second measuring unit is a synchronous phasor measurement unit.

An embodiment of the present disclosure provides an apparatus for detecting an islanding state of a power generation device, the apparatus includes: a first acquisition unit for acquiring a first voltage phasor and a first current phasor at a substation; a second acquisition unit for acquiring a second voltage phasor at the power generation device; a processing unit connected with the first acquisition unit and the second acquisition unit, for determining an interconnection impedance between the power generation device and the substation within a predetermined time period, and determining that the power generation device is in an islanding state under the condition that the interconnection impedance is greater than a predetermined interconnection threshold, wherein the determination of the interconnection impedance between the power generation device and the substation includes the following calculation:

$$\left| \frac{\Delta \dot{U}_1 \dot{U}_2 - \Delta \dot{U}_2 \dot{U}_1}{\Delta \dot{I}_1 \dot{U}_1 - \Delta \dot{U}_1 \dot{I}_1} \right|$$

wherein, $\dot{U}_1$ represents the first voltage phasor, $\Delta \dot{U}_1$ represents the variation of the first voltage phasor within the predetermined time period, $\dot{U}_2$ represents the second voltage phasor, $\Delta \dot{U}_2$ represents the variation of the second voltage phasor within the predetermined time period, $\dot{I}_1$ represents the first current phasor and $\Delta \dot{I}_1$ represents the variation of the first current phasor within the predetermined time period.

The apparatus, method and system for detecting the islanding state of a power generation device according to the present disclosure determines whether the power generation device is separated from the main power grid by calculating the degree of electrical correlation between the power generation device and the substation, and therefore determines whether the power generation device is in an islanding state. The apparatus, method and system are realized based on a synchronous phasor measurement unit, and are different from the traditional active or passive islanding detection schemes, which have very high sensitivity compared with the traditional passive islanding detection schemes, i.e., have a very small detection blind area, and will not output disturbance to the power grid and therefore will not damage the power quality compared with the traditional active islanding detection schemes.

BRIEF DESCRIPTION OF DRAWINGS

In order to explain the technical scheme of the embodiment of the present disclosure more clearly, the drawings required for use in the description of the embodiment will be briefly introduced below. The drawings in the following description are only exemplary embodiments of the present disclosure.

DETAILED DESCRIPTION

Figure 1:
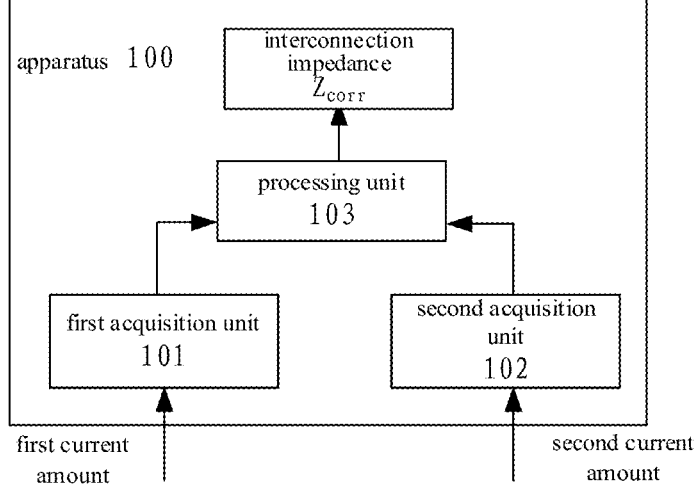
FIG. 1 shows a schematic block diagram of an apparatus for detecting an islanding state of a power generation device according to an embodiment of the present disclosure.

In order to make the purposes, technical schemes and advantages of the present disclosure more obvious, example embodiments according to the present disclosure will be described in detail below with reference to the accompanying drawings. Obviously, the described embodiments are only a part of the embodiments of the present disclosure, not all the embodiments of the present disclosure, and it should be understood that the present disclosure is not limited by the example embodiments described herein.

In the present specification and the drawings, basically the same or similar steps and elements are denoted by the same or similar reference numerals, and repeated descriptions of these steps and elements will be omitted. Meanwhile, in the description of the present disclosure, the terms "first", "second" and so on are only used to distinguish descriptions, and cannot be understood as indicating or implying relative importance or ranking.

In the present specification and drawings, according to embodiments, elements are described in singular or plural forms. However, the singular and plural forms are appropriately selected for the proposed situation only for convenience of explanation and are not intended to limit the present disclosure. Therefore, the singular form can include the plural form, and the plural form can also include the singular form unless the context clearly states otherwise. In the embodiments of the present disclosure, unless clearly stated otherwise, "connection" does not mean that it must "direct connection" or "direct touch", while only electrical and/or communication connection is required.

FIG. 1 shows a schematic block diagram of an apparatus 100 for detecting an islanding state of a power generation device according to an embodiment of the present disclosure. The device for detecting the islanding state of the power generation device includes a first acquisition unit 101, a second acquisition unit 102 and a processing unit 103. The first acquisition unit 101 is for acquiring a first current amount at a substation. The second acquisition unit 102 is for acquiring a second voltage phasor at the power generation device. The processing unit 103 is connected with the first acquisition unit 101 and the second acquisition unit 102, and is used for determining the interconnection impedance $Z_{corr}$ between the power generation device and the substation according to the ratio of the variation of the second voltage phasor and the variation of the first current within a same time period, and determining that the power generation device is in an islanding state under the condition that the interconnection impedance $Z_{corr}$ meets a predetermined condition.

According to an embodiment of the present disclosure, the first current obtained at a substation may be, e.g., a vector $\dot{I}_1$, e.g., a current phasor measured by a synchronous phasor measurement unit, or a scalar $I_1$, e.g., an effective value of a current measured by a current transformer. The variation of the vector of the first current corresponds to the variation of the scalar of the first current, because the frequency of the current of the main power grid on the substation side will not change regardless of whether the islanding occurs or not, therefore $|\dot{I}_1(t+\Delta t) - \dot{I}_1(t)| = |\Delta \dot{I}_1| = \sqrt{2}\Delta I_1$, wherein $\dot{I}_1$ is the current phasor and $I_1$ is the effective value of the current. Therefore, the interconnection impedance $Z_{corr}$ can be calculated by the following formula according to the second voltage phasor variation and the first current variation within a same time period:

$$Z_{corr} = |\dot{Z}_{corr}| = \left| \frac{\Delta \dot{U}_2}{\Delta \dot{I}_1} \right| = \frac{|\Delta \dot{U}_2|}{\sqrt{2}\Delta I_1} \qquad (1)$$

According to an embodiment of the present disclosure, the predetermined condition may be to compare the interconnection impedance $Z_{corr}$ with a predetermined interconnection threshold $Z_{corr\text{-}set}$. Under the condition that the interconnection impedance $Z_{corr}$ is greater than the predetermined interconnection threshold $Z_{corr\text{-}set}$, that is $$Z_{corr} > Z_{corr\text{-}set} \qquad (2)$$

the processing unit can determine that there is no electrical correlation between the power generation device and the substation, i.e., the electrical connection between the power generation device and the substation is disconnected, thus it can be determined that the power generation device is in an islanding state.

According to an embodiment of the present disclosure, before determining the interconnection impedance $Z_{corr}$, the processing unit 103 compares the modulus of the variation of the second voltage phasor $|\Delta \dot{U}_2|$ with a predetermined voltage change threshold $U_{\Delta set}$, and the processing unit 103 determines the interconnection impedance $Z_{corr}$ under the condition that the modulus of the variation of the second voltage phasor $|\Delta \dot{U}_2|$ is greater than or equal to the predetermined voltage change threshold $U_{\Delta set}$. That is, the processing unit 103 calculates the interconnection impedance $Z_{corr}$ according to equation (1) only under the condition that $|\Delta \dot{U}_2| \geq U_{\Delta set}$.

Figure 2:
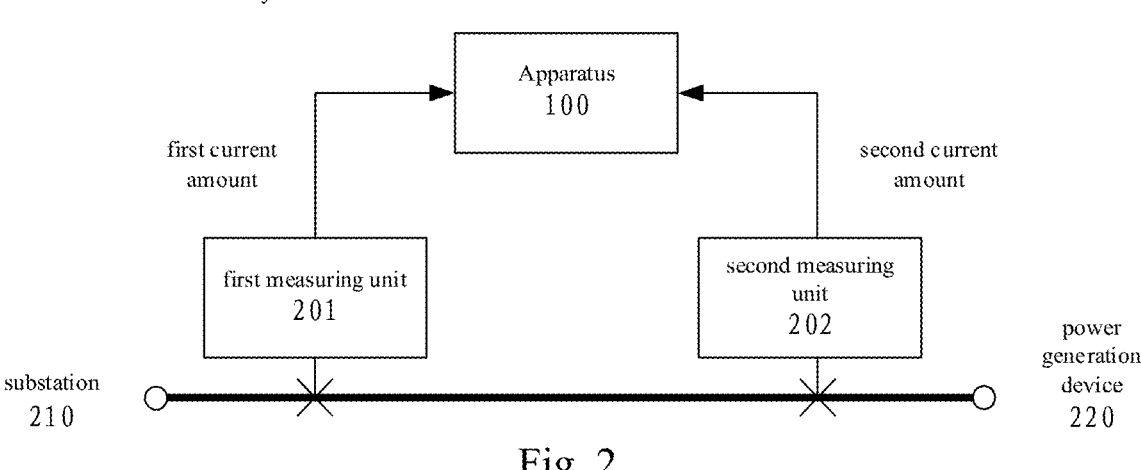
FIG. 2 shows a schematic diagram of a system for detecting an islanding state of a power generation device according to an embodiment of the present disclosure.

FIG. 2 shows a schematic diagram of a system for detecting an islanding state of a power generation device according to an embodiment of the present disclosure, which includes the apparatus 100 for detecting the islanding state of the power generation device as shown in FIG. 1, a first measuring unit 201 and a second measuring unit 202. The first measuring unit 201 is arranged at a substation 210 for measuring a first current amount at the substation 210. The second measuring unit 202 is arranged at a power generation device 220 for measuring a second voltage phasor at the power generation device 220. The apparatus 100 is connected with the first measuring unit 201 and the second measuring unit 220. The apparatus 100 for detecting the islanding state of a power generation device, e.g., can be connected with the first measuring unit 201 and the second measuring unit 220 in a wired or wireless way, thus the first measuring unit 201 can send the first current amount at the substation 210 to the apparatus 100, and the second measuring unit 202 can send the second voltage phasor at the power generation device 220 to the device 100. The apparatus 100 can calculate the interconnection impedance $Z_{corr}$ between the power generation device 220 and the substation 210 as described in detail above, and determine whether the power generation device 220 is disconnected from the substation 210 and therefore is in an islanding state.

According to an embodiment of the present disclosure, the second measuring unit 202 is, e.g., a synchronous phasor measurement unit (PMU), and particularly can be a micro synchronous phasor measurement unit (μPMU). The synchronous phasor measurement unit is a phasor measuring unit composed of the Global Positioning System (GPS) second pulse as the synchronous clock. The second measuring unit 202 measures the second voltage phasor at the power generation device 220 as a PMU and sends it to the apparatus 100.

According to an embodiment of the present disclosure, the first measuring unit 201, e.g., may also be a PMU. In this case, the first measuring unit 201 measures the first current phasor at the substation 210 and sends it to the apparatus 100, and the first current phasor and the second voltage phasor are sent to the device 100 synchronously in time. In addition, the first measuring unit 201 may be, e.g., a measuring device for measuring the effective value of the current, e.g. a current transformer. The first measuring unit 201 sends a first current amount as a scalar to the apparatus 100. In this case, it is also necessary to guarantee that the first current amount as a scalar is synchronized with the second voltage phasor in time.

Figure 3:
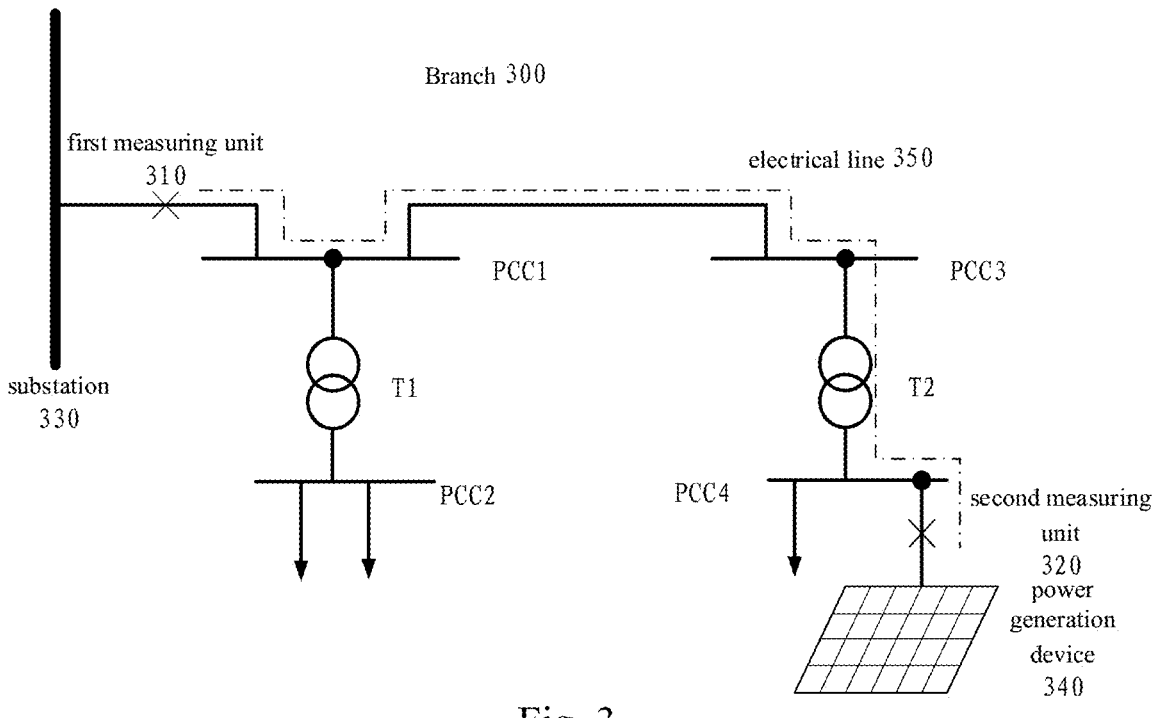
FIG. 3 shows a schematic diagram of the connection of a power generation device and a substation according to an embodiment of the present disclosure.

FIG. 3 shows a schematic diagram of the connection of a power generation device and a substation according to an embodiment of the present disclosure. In FIG. 3, a substation 330 is shown, and a branch 300 is led out from a bus of the substation 330. A load and a power generation device can be connected on the branch 300. In the exemplary diagram shown in FIG. 3, a transformer T1 is connected to the point of common coupling PCC1 on the branch 300, which is further connected with the point of common coupling PCC2 through the transformer T1, and the point of common coupling PCC2 can be connected with a load or power generation device. Similarly, another point of common coupling PCC3 on the branch 300 is connected with a transformer T2, which is further connected with the point of common coupling PCC4, the point of common coupling PCC4 can be connected with a load or a power generation device, and the power generation device 340 is shown here. The power generation device 340 can be either a power generator or a renewable energy power generation device, e.g., a photovoltaic device (as shown in FIG. 3), a wind turbine, etc.

Under the normal operation of the branch 300, the electrical line 350 from the substation 330 to the power generation device 340 remains connected, and the electrical line 350 is shown by a dotted line in FIG. 3. Under the condition that any point in the electrical line 350 is disconnected, the power generation device 340 will form an island power grid together with nearby loads, e.g., Under the condition that line disconnection occurs at the point of common coupling PCC3, the power generation device 340 and the load connected at the point of common coupling PCC4 form an island power grid, and only the power generation device 340 supply power to these loads. In order to detect the island power grid that might be composed of the power generation device 340, i.e., to detect whether the electrical line 350 is disconnected, the first measuring unit 310 is arranged at the substation 330, and the second measuring unit 320 is arranged at the power generation device 340.

Figure 4:
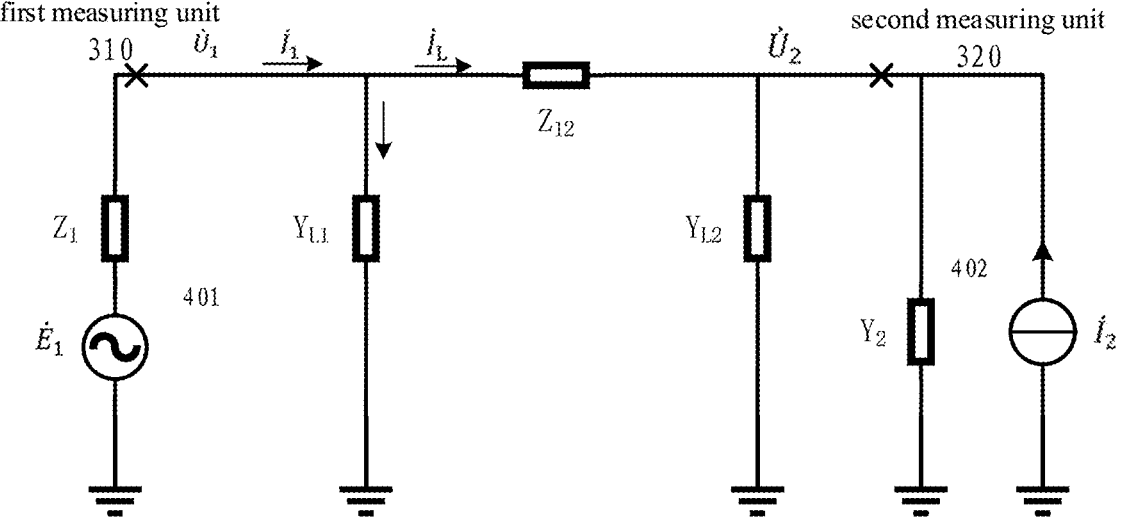
FIG. 4 shows an equivalent circuit diagram of the connection of a power generation device and a substation according to an embodiment of the present disclosure.

FIG. 4 shows an equivalent circuit diagram of the connection of a power generation device and a substation according to an embodiment of the present disclosure. Substation 330 in FIG. 3 can be equivalent to the voltage source 401 with the voltage phasor $\dot{E}_1$ and impedance $\dot{Z}_1$ on the left in FIG. 4. The power generation device 430 in FIG. 3 can be equivalent to the current source with the current phasor $\dot{I}_2$ and the admittance $\dot{Y}_2$ in FIG. 4. The electrical line 350 between the power generation device 340 and the substation 330 can be equivalent to π shape equivalent circuit, which has the impedance $\dot{Z}_{12}$ and the admittance to the ground $\dot{Y}_{L1}$ and $\dot{Y}_{L2}$.

The voltage phasor at the substation is $\dot{U}_1$, the current phasor at the substation is $\dot{I}_1$, and the voltage phasor at the power generation device is $\dot{U}_2$. According to the voltage drop on the impedance $\dot{Z}_{12}$, the following equation can be established:

$$\dot{U}_1 - \dot{U}_2 = (\dot{I}_1 - \dot{Y}_{L1}\dot{U}_1)\dot{Z}_{12} \qquad (3)$$

That is, the voltage drop caused by the current $\dot{I}_1 - \dot{Y}_{L1}\dot{U}_1$ flowing through the impedance $\dot{Z}_{12}$ equals to the voltage difference $\dot{U}_1 - \dot{U}_2$ from the substation to the power generation device.

It is assumed that the output power of the power generation device 340 is changed, which causes the voltage phasor $\dot{U}_1$ at the substation, the current phasor $\dot{I}_1$ and the voltage phasor at $\dot{U}_2$ at the power generation device to change as follows within a time period $\Delta T$:

$$\begin{cases} \Delta\dot{U}_1 = \dot{U}_1(t+\Delta T) - \dot{U}_1(t) \\ \Delta\dot{U}_2 = \dot{U}_2(t+\Delta T) - \dot{U}_2(t) \\ \Delta\dot{I}_1 = \dot{I}_1(t+\Delta T) - \dot{I}_1(t) \end{cases} \quad (4)$$

similar to equation (3), the following equation can be established according to the voltage drop on the impedance $\dot{Z}_{12}$:

$$\Delta\dot{U}_1 - \Delta\dot{U}_2 = (\Delta\dot{I}_1 - \dot{Y}_{L1}\Delta\dot{U}_1)\dot{Z}_{12} \quad (5)$$

after bringing equation (5) into equation (3), we get:

$$\dot{Z}_{12} = \frac{\Delta\dot{U}_1\dot{U}_2 - \Delta\dot{U}_2\dot{U}_1}{\Delta\dot{I}_1\dot{U}_1 - \Delta\dot{U}_1\dot{I}_1} \quad (6)$$

wherein, the time period $\Delta T$ can take a value in the range of 0.1 s to 2 s, preferably $\Delta T$ is, e.g., 2 s. Therefore, $\Delta\dot{U}_1$, $\Delta\dot{U}_2$ and $\Delta\dot{I}_1$ are correspond to the variations within the time period $\Delta T$, respectively.

Under the condition that the electrical line 350 between the substation 330 and the power generation device 340 remains connected, the impedance $\dot{Z}_{12}$ between them is equal to the impedance $\dot{Z}_L$ of the electrical line 350 is approximately equal to the sum of the impedances of all overhead lines, cables and transformers in the electrical line 350, and it has a very small value.

However, under the condition that any position on the electrical line 350 is disconnected, i.e., under the condition that the power generation device 340 forms an island power grid, the power generation device 340 cannot supply power to the nearby load self-sufficiently, therefore the voltage frequency output by the power generation device 340 will change under the condition of power imbalance, and therefore the voltage phasor $\dot{U}_2$ will change continuously. In addition, on the substation side, the main power grid will produce power changes due to load changes. These above-mentioned changes will lead to the impedance value, i.e., the modulus of the impedance $|\dot{Z}_{12}|$ between the substation 330 and the power generation device 340 becomes larger, and it is much larger than the impedance $\dot{Z}_L$ of the electrical line 350

In order to calculate the modulus of impedance $|\dot{Z}_{12}|$ according to equation (6), embodiments according to the present disclosure provide an apparatus for detecting the islanding state of a power generation device, which includes a first acquisition unit, a second acquisition unit and a processing unit. The first acquisition unit is for acquiring a first voltage phasor $\dot{U}_1$ and a first current phasor $\dot{I}$ at a substation 330. The second acquisition unit is for acquiring a second voltage phasor $\dot{U}_2$ at the power generation device 340. The processing unit is connected with the first acquisition unit and the second acquisition unit, and determines the interconnection impedance $|\dot{Z}_{corr}| = |\dot{Z}_{12}|$ between the power generation device 340 and the substation 330 through equation (6), i.e., first, calculate the variation $\Delta\dot{U}_1$ of the first voltage phasor multiplied by the second voltage phasor $\dot{U}_2$ minus the variation $\Delta\dot{U}_2$ of the second voltage phasor multiplied by the first voltage phasor $\dot{U}_1$; then calculate the variation $\Delta\dot{I}_1$ of the first current phasor multiplied by the first voltage phasor $\dot{U}_1$ minus the variation $\Delta\dot{U}_1$ of the first voltage phasor multiplied by the first current phasor $\dot{I}_1$; finally, calculate the modulus of their ratio:

$$Z_{corr} = |\dot{Z}_{corr}| = |\dot{Z}_{12}| = \left| \frac{\Delta\dot{U}_1\dot{U}_2 - \Delta\dot{U}_2\dot{U}_1}{\Delta\dot{I}_1\dot{U}_1 - \Delta\dot{U}_1\dot{I}_1} \right| \quad (7)$$

under the condition that the interconnection impedance $Z_{corr}$ is greater than a predetermined interconnection threshold $Z_{corr\text{-}set}$, i.e., $Z_{corr} > Z_{corr\text{-}set}$, it is determined that the power generation device is in an islanding state.

After the power generation device 340 is disconnected from the substation 330, although power changes will occur at both the power generation device side and the substation side, the voltage phasor changes at the substation side are very small and almost negligible. Therefore, it can be assumed that:

$$\Delta\dot{U}_1 \approx 0 \quad (8)$$

Therefore, equation (7) can be simplified as:

$$Z_{corr} = |\dot{Z}_{corr}| = \left| \frac{\Delta\dot{U}_1\dot{U}_2 - \Delta\dot{U}_2\dot{U}_1}{\Delta\dot{I}_1\dot{U}_1 - \Delta\dot{U}_1\dot{I}_1} \right| \approx \left| \frac{\Delta\dot{U}_2}{\Delta\dot{I}_1} \right| \quad (9)$$

since the frequency of the current of the main power grid at the substation side will not change, the change of the current phasor $|\Delta\dot{I}_1|$ at the substation is equal to the change of the current amplitude, i.e., $|\Delta\dot{I}_1| = \sqrt{2}\Delta I_1$, where $\Delta I_1$ is the effective value of the current change at the substation, thus obtaining the aforementioned equation (1):

$$Z_{corr} = |\dot{Z}_{corr}| \approx \left| \frac{\Delta\dot{U}_2}{\Delta\dot{I}_1} \right| = \frac{|\Delta\dot{U}_2|}{\sqrt{2}\,\Delta I_1}$$

Under the condition that the power generation device 340 and the substation 330 remain electrical correlations, the interconnection impedance $Z_{corr}$ is equal to the impedance value of the electrical line 350, which has a very small value. However, under the condition that the power generation device 340 loses electrical correlation with the substation 330, the voltage phasor at the power generation device 340 changes, especially the frequency of the voltage phasor changes due to the unbalanced power of the island power grid. In addition, due to the loss of load, the current value at the substation 330 will also change. These changes cause the interconnection impedance $Z_{corr}$ to become larger and much larger than the impedance value of the electrical line 350.

According to an embodiment of the present disclosure, e.g., the predetermined interconnection threshold $Z_{corr\text{-}set}$ is set to be equal to or greater than the impedance value of the electrical line 350, i.e., the sum of the impedances of all overhead lines, cables and transformers in the electrical line 350. Preferably, the predetermined interconnection threshold $Z_{corr\text{-}set}$ is, e.g., several tens of ohms, e.g. 10 Ω or 20Ω.

Figures 5, 6:
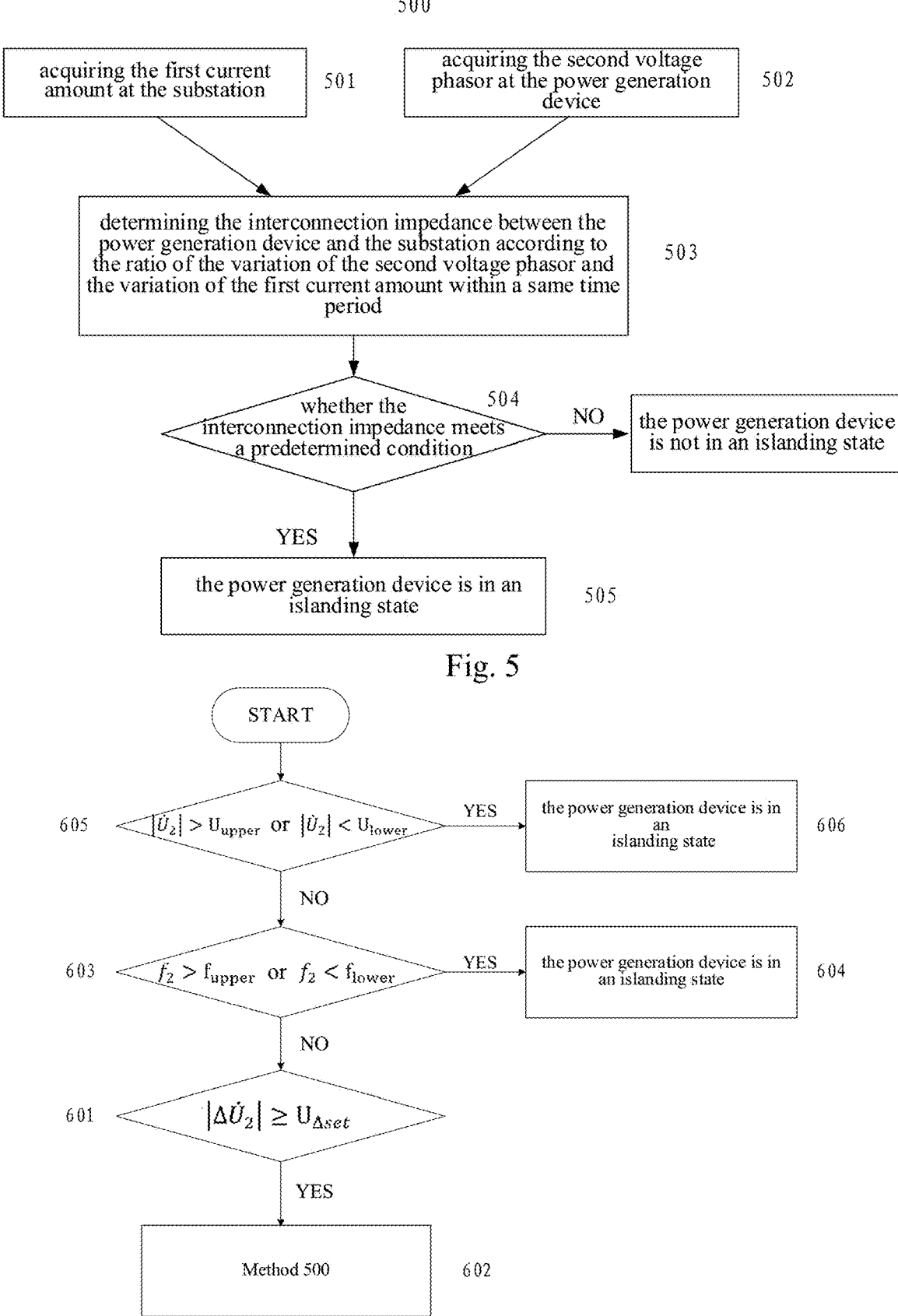
FIG. 5 shows a flowchart of a method for detecting an islanding state of a power generation device according to an embodiment of the present disclosure.
FIG. 6 shows a flowchart of a method for detecting an islanding state of a power generation device according to another embodiment of the present disclosure.

FIG. 5 shows a method 500 for detecting an islanding state of a power generation device according to an embodiment of the present disclosure. In method 500, acquiring the first current amount at the substation (step 501), acquiring the second voltage phasor at the power generation device (step 502), and determining the interconnection impedance between the power generation device and the substation according to the ratio of the variation of the second voltage phasor and the variation of the first current amount within a same time period (step 503), and under the condition that the interconnection impedance meets a predetermined condition, (step 504), determining that the power generation device is in an islanding state (step 505). According to an embodiment of the present disclosure, the predetermined condition may be to compare the interconnection impedance $Z_{corr}$ with a predetermined interconnection threshold $Z_{corr\text{-}set}$, and under the condition that the interconnection impedance $Z_{corr}$ is greater than the predetermined interconnection threshold $Z_{corr\text{-}set}$, i.e., $Z_{corr} > Z_{corr\text{-}set}$, the processing unit can determine that there is no electrical correlation between the power generation device and the substation.

FIG. 6 shows a flowchart of a method 600 for detecting an islanding state of a power generation device according to another embodiment of the present disclosure. According to the embodiment of the present disclosure, before executing the method 500, the modulus of the variation of the second voltage phasor $|\Delta \dot{U}_2|$ can be compared with a predetermined voltage change threshold $U_{\Delta set}$, i.e., and under the condition that the modulus of the variation of the second voltage phasor is greater than or equal to the predetermined voltage change threshold, i.e., $|\Delta \dot{U}_2| \geq U_{\Delta set}$ (step 601), the processing unit determines the interconnection impedance, i.e., executes the method 500 shown in FIG. 5 (step 602).

According to an embodiment of the present disclosure, before executing step 601, the frequency value of the second voltage phasor $f_2$ is compared with a predetermined upper frequency threshold $f_{upper}$ and a predetermined lower frequency threshold $f_{lower}$, and under the condition that the frequency value of the second voltage phasor is greater than or less than the predetermined upper frequency threshold, i.e., $f_2 > f_{upper}$ or $f_2 < f_{lower}$ (step 603), it is determined that the power generation device is in an islanding state (step 604). Under the condition that the frequency offset of the second voltage phasor at the power generation device is too large, it can be directly determined that the power generation device is in an islanding state.

According to an embodiment of the present disclosure, before executing step 601, the modulus of the second voltage phasor $|\dot{U}_2|$ can be compared with a predetermined upper voltage threshold $U_{upper}$ and a predetermined lower voltage threshold $U_{lower}$, and under the condition that the modulus of the second voltage phasor is greater than or less than the predetermined upper voltage threshold, i.e., $|\dot{U}_2| > U_{upper}$ or $|\dot{U}_2| < U_{lower}$ (step 605), it is determined that the power generation device is in an islanding state (step 606). The modulus of the second voltage phasor $|\dot{U}_2|$ is equal to $\sqrt{2}U_2$, where $U_2$ is the effective value of the second voltage. Therefore, according to another embodiment of the present disclosure, an additional voltage measuring unit may be provided to measure the effective value of the second voltage $U_2$ and compare it with a predetermined additional upper voltage threshold $U'_{upper}$ and an additional lower voltage threshold $U'_{lower}$, and under the case that the effective value of the second voltage $U_2$ is greater than the predetermined additional upper voltage threshold or less than the predetermined additional lower voltage threshold, i.e., $U_2 > U'_{upper}$ or $U_2 < U'_{lower}$, it is determined that the power generation device is in an islanding state. Under the condition that the modulus of the second voltage phasor $|\dot{U}_2|$ or the effective value of the second voltage $U_2$ at the power generation device is too large, it can be directly determined that the power generation device is in an islanding state.

According to the embodiment of the present disclosure, the execution order of step 603 and step 605 can be interchanged or can be executed in parallel.

By executing step 601, step 603 and step 605 in advance, the islanding state or non-islanding state with obvious features can be judged through simple steps, thereby can save the calculation amount and speeds up the speed of judging whether the power generation device is in the islanding state.

According to the apparatus, methods and systems for detecting an islanding state of a power generation device, it is determined whether the power generation device is separated from the main power grid by calculating the degree of electrical correlation between the power generation device and the substation, and therefore determined whether the power generation device is in the islanding state. The apparatus, method and system are realized based on a synchronous phasor measurement unit, and are different from the traditional active or passive islanding detection schemes, which have very high sensitivity compared with the traditional passive islanding detection schemes, i.e., have a very small detection blind area, and will not output disturbance to the power grid and therefore will not damage the power quality compared with the traditional active islanding detection schemes.

The block diagrams of circuits, units, means, apparatus, devices and systems involved in the present disclosure are only illustrative examples, and are not intended to require or imply that they must be connected, arranged and configured in the manner shown in the block diagram. As those skilled in the art will recognize, these circuits, units, means, apparatus, devices and systems can be connected, arranged and configured in any way, as long as the desired purpose can be achieved. The circuits, units, means and apparatus involved in the present disclosure can be implemented in any suitable way, e.g., by employing application specific-integrated circuits, field programmable gate arrays (FPGA), etc., or by employing general processing units combined with known programs.

It should be understood by those skilled in the art that the above-mentioned specific embodiments are only examples rather than limitations, and various modifications, combinations, partial combinations and substitutions can be made to the embodiments of the present disclosure according to design requirements and other factors, as long as they are within the scope of the appended claims or their equivalents, i.e., they belong to the scope of rights to be protected by the present disclosure.

What is claimed is:

1. An apparatus comprising:
   a first acquisition unit for acquiring a current amount at a substation;
   a second acquisition unit for acquiring a voltage phasor at a power generation device; and
   a processing unit connected with the first acquisition unit and the second acquisition unit, for determining an interconnection impedance between the power generation device and the substation according to a ratio of a variation of the voltage phasor and a variation of the current amount within a same time period, and determining that the power generation device is in an islanding state under the condition that the interconnection impedance meets a predetermined condition.

2. The apparatus according to claim 1, wherein the current amount is a current phasor.

3. The apparatus according to claim 1, wherein before determining the interconnection impedance, the processing unit compares a modulus of the variation of the voltage phasor with a predetermined voltage change threshold, and the processing unit determines the interconnection impedance under the condition that a modulus of the variation of the voltage phasor is greater than or equal to a predetermined voltage change threshold.

4. The apparatus according to claim 1, wherein before determining the interconnection impedance, the processing unit compares a modulus of the voltage phasor with a predetermined upper voltage threshold and a predetermined lower voltage threshold, and determines that the power generation device is in an islanding state under the condition that a modulus of the voltage phasor is greater than a predetermined upper voltage threshold or less than a predetermined lower voltage threshold.

5. The apparatus according to claim 1, wherein before determining the interconnection impedance, the processing unit compares a frequency value of the voltage phasor with a predetermined upper frequency threshold and a predetermined lower frequency threshold, and determines that the power generation device is in an islanding state under the condition that a frequency value of the voltage phasor is greater than a predetermined upper frequency threshold or less than a predetermined lower frequency threshold.

6. The apparatus according to claim 1, wherein the current amount is a current phasor.

7. A system comprising:
the apparatus according to claim 1;
a first measuring unit arranged at a substation for measuring the current amount at the substation;
a second measuring unit arranged at the power generation device for measuring the voltage phasor at the power generation device;
wherein the apparatus is connected with the first measuring unit and the second measuring unit.

8. The system according to claim 7, wherein the second measuring unit is a synchronous phasor measurement unit.

9. A method comprising:
acquiring a current amount at a substation;
acquiring a voltage phasor at a power generation device;
determining an interconnection impedance between the power generation device and the substation according to a ratio of a variation of the voltage phasor and a variation of the current amount within a same time period; and
determining that the power generation device is in an islanding state under the condition that the interconnection impedance meets a predetermined condition.

10. An apparatus comprising:
a first acquisition unit for acquiring a first voltage phasor and a first current phasor at a substation;
a second acquisition unit for acquiring a second voltage phasor at a power generation device; and
a processing unit connected with the first acquisition unit and the second acquisition unit, for determining an interconnection impedance between the power generation device and the substation within a predetermined time period, and determining that the power generation device is in an islanding state under a condition that the interconnection impedance is greater than a predetermined interconnection threshold, wherein
the interconnection impedance is determined based on a ratio corresponding to a voltage drop caused by a current flowing through an equivalent impedance between the substation and the power generation device.

11. The apparatus of claim 9, wherein the ratio corresponds to a variation of the second voltage phasor and a variation of the first current phasor.

12. The apparatus of claim 9, wherein the equivalent impedance is obtained from a p-shape equivalent circuit.

13. The apparatus of claim 9, wherein the p-shape equivalent circuit includes the equivalent impedance between two admittances to ground.

14. The apparatus of claim 9, wherein at least one of the variation of the second voltage phasor and a variation of the first current phasor is caused by a change in an output power of the power generation device.

15. An apparatus comprising:
a first measuring unit configured to measure at least one of a frequency value of a voltage phasor, a modulus of the voltage phasor, or an effective value of the voltage phasor at a power generation device;
a processing unit connected to the first measuring unit and configured to determine an islanding state of the power generation device based on a comparison of the measured at least one of the frequency value of the voltage phasor, the modulus of the voltage phasor, or the effective value of the voltage phasor with one of an upper threshold or a lower threshold,
wherein the power generation device is connected to a substation through an electrical line and the islanding state is caused by a disconnection between the power generation device and the substation.

16. The apparatus of claim 15, wherein
the upper threshold is a predetermined upper frequency threshold and the lower threshold is a predetermined lower frequency threshold, and
the power generation device is in the islanding state when the frequency value is greater than the upper threshold or less than the lower threshold.

17. The apparatus of claim 15, wherein
the upper threshold is a predetermined upper voltage threshold and the lower threshold is a predetermined lower voltage threshold, and
the power generation device is in the islanding state when the modulus of the voltage phasor is greater than the upper threshold or lower than the lower threshold.

18. The apparatus of claim 15, further comprising
a second measuring unit configured to measure a current amount at the substation, and
wherein the processing unit is further connected to the second measuring unit and is further configured to compare a modulus of a variation of the voltage phasor with a predetermined voltage change threshold, and the processing unit determines an interconnection impedance between the power generation device and the substation under a condition that a modulus of the variation of the voltage phasor is greater than or equal to a predetermined voltage change threshold.

19. The apparatus of claim 17, wherein
the processing unit determines the interconnection impedance according to a ratio of a variation of the voltage phasor and a variation of the current amount within a same time period, and determines that the power generation device is in the islanding state under a condition that the interconnection impedance meets a predetermined condition.

* * * * *